(12) United States Patent
Goda et al.

(10) Patent No.: US 9,202,574 B2
(45) Date of Patent: Dec. 1, 2015

(54) MEMORY DEVICE HAVING A DIFFERENT SOURCE LINE COUPLED TO EACH OF A PLURALITY OF LAYERS OF MEMORY CELL ARRAYS

(71) Applicant: Micron Technology, Inc., Boise, ID (US)

(72) Inventors: Akira Goda, Boise, ID (US); Zengtao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 14/037,488

(22) Filed: Sep. 26, 2013

(65) Prior Publication Data

US 2014/0036586 A1 Feb. 6, 2014

Related U.S. Application Data

(62) Division of application No. 13/043,005, filed on Mar. 8, 2011, now Pat. No. 8,559,231.

(51) Int. Cl.
| | |
|---|---|
| *G11C 16/10* | (2006.01) |
| *G11C 5/02* | (2006.01) |
| *G11C 16/04* | (2006.01) |
| *G11C 11/56* | (2006.01) |
| *G11C 16/28* | (2006.01) |

(52) U.S. Cl.
CPC ...... *G11C 16/10* (2013.01); *G11C 5/02* (2013.01); *G11C 5/025* (2013.01); *G11C 11/5642* (2013.01); *G11C 16/0483* (2013.01); *G11C 16/28* (2013.01)

(58) Field of Classification Search
CPC ....... G11C 5/02; G11C 5/025; G11C 16/0483
See application file for complete search history.

(56) References Cited

U.S. PATENT DOCUMENTS

| | | | |
|---|---|---|---|
| 6,646,924 B1 | 11/2003 | Tsai et al. | |
| 6,954,394 B2 | 10/2005 | Knall et al. | |
| 7,701,761 B2 | 4/2010 | Pan et al. | |
| 7,889,571 B2* | 2/2011 | Norman | 365/189.05 |
| 7,940,578 B2 | 5/2011 | Kang et al. | |
| 8,004,893 B2* | 8/2011 | Sim et al. | 365/185.05 |
| 8,064,272 B2 | 11/2011 | Nagashima et al. | |
| 2008/0048237 A1* | 2/2008 | Iwata | 257/314 |
| 2008/0099819 A1* | 5/2008 | Kito et al. | 257/315 |
| 2008/0181008 A1 | 7/2008 | Lee et al. | |
| 2009/0141556 A1 | 6/2009 | Baik | |
| 2009/0168533 A1* | 7/2009 | Park et al. | 365/185.17 |
| 2009/0296476 A1* | 12/2009 | Shin et al. | 365/185.17 |
| 2010/0128521 A1 | 5/2010 | Mizuguchi et al. | |
| 2010/0172182 A1* | 7/2010 | Seol et al. | 365/185.17 |
| 2010/0177566 A1* | 7/2010 | Kim et al. | 365/185.17 |
| 2010/0211852 A1 | 8/2010 | Lee et al. | |
| 2010/0259987 A1 | 10/2010 | Lee et al. | |
| 2010/0322000 A1 | 12/2010 | Shim et al. | |
| 2011/0051527 A1* | 3/2011 | Kirisawa et al. | 365/185.29 |
| 2011/0063914 A1* | 3/2011 | Mikajiri et al. | 365/185.15 |
| 2011/0205802 A1* | 8/2011 | Choe et al. | 365/185.18 |
| 2012/0002477 A1* | 1/2012 | Tang et al. | 365/185.17 |
| 2012/0051137 A1* | 3/2012 | Hung et al. | 365/185.17 |
| 2013/0107628 A1* | 5/2013 | Dong et al. | 365/185.17 |

* cited by examiner

*Primary Examiner* — Vanthu Nguyen
(74) *Attorney, Agent, or Firm* — Dicke, Billig & Czaja, PLLC

(57) ABSTRACT

In an embodiment, a memory device may have a plurality of layers of memory cell arrays. Each layer may have a plurality of strings of memory cells and a different source line coupled to each layer of the plurality of layers.

12 Claims, 13 Drawing Sheets

MEMORY DEVICE HAVING A DIFFERENT SOURCE LINE COUPLED TO EACH OF A PLURALITY OF LAYERS OF MEMORY CELL ARRAYS

RELATED APPLICATION

This application is a divisional of U.S. application Ser. No. 13/043,005, titled "SENSE OPERATION IN A STACKED MEMORY ARRAY DEVICE," filed Mar. 8, 2011, and issued as U.S. Pat. No. 8,559,231 on Oct. 15, 2013, which is commonly assigned and incorporated in its entirety herein by reference.

TECHNICAL FIELD

The present embodiments relate generally to memory and a particular embodiment relates to sense operations in a stacked memory array device.

BACKGROUND

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, flash drives, digital cameras, and cellular telephones. Program code and system data such as a basic input/output system (BIOS) are typically stored in flash memory devices for use in personal computer systems.

A typical flash memory device is a type of memory in which the array of memory cells is typically organized into memory blocks that can be erased and reprogrammed on block-by-block basis instead of one byte at a time. Changes in a threshold voltage of each of the memory cells, through erasing or programming of a charge storage structure (e.g., floating gate or charge trap) or other physical phenomena (e.g., phase change or polarization), determine the data value of each cell. The data in a cell of this type is determined by the presence or absence of the charge in the charge storage structure.

A three dimensional memory device uses stacked memory arrays on a single die. Such a memory architecture allows higher memory density in substantially the same die footprint. FIG. 1 illustrates one example of the architecture of a typical prior art stacked NAND flash memory array.

The embodiment of FIG. 1 shows a two layer 100, 101 stacked architecture. Both layers 100, 101 share the same source line 103, access lines (e.g., word lines) 105-107, and select gate source lines 110. Each layer 100, 101 is selected by the data line (e.g., bit line) 120, 121 bias. In the illustrated example, the bottom layer array 101 is coupled to bit line BL0 120 and the top layer array 100 is coupled to bit line BL1 121.

FIGS. 2A-2C show diagrams of voltages for typical prior art memory operations (e.g., programming FIG. 2A, sense FIG. 2B, and erase FIG. 2C) that can be executed in a stacked memory array architecture. To better illustrate the operations, a four layer architecture is assumed.

The programming operation includes applying a programming voltage (e.g., 20V) to the selected word lines 201 being programmed. Since a word line is shared by all layers, bit line biasing (e.g., applying a bit line voltage) is used to inhibit layers that are not selected for programming. In the illustrated example, the first and third layers are selected to be programmed so their respective bit lines are biased at an enable voltage (e.g., 0V) while the unselected bit lines are biased at an inhibit voltage (e.g., 2V). Thus, the first and third layers are selected while the second and fourth layers are unselected.

For erase and sense operations, all of the layers can be selected substantially simultaneously while, in the sense operation, only one row of each layer is selected. For example, during a sense operation, all of the bit lines are biased at a lower voltage (e.g., 0.5V) while the read voltage ($V_r$) is applied to the common word line 202. The unselected word lines are biased at some pass voltage $V_{pass}$ (e.g., 6V), the select gate lines are turned on (e.g., 5V).

During an erase operation, all of the bit lines are biased at a relatively large erase voltage (e.g., 20V) while all of the word lines are biased at a reference voltage (e.g., 0V). The select gate drain lines and common select gate source lines are biased with a relatively large voltage (e.g., 20V).

One problem with programming in a stacked memory array architecture is the programming disturb that can occur due to a programming rate offset between layers. For example, referring to FIG. 2A, if the first layer programs at a slower rate than the fourth layer, the relatively large voltages applied to the slower first layer in order to continue programming the first layer for a longer time than the faster fourth layer can cause programming stress to the fourth layer. Such disturb can cause errors during sense operations since the memory cell threshold voltages on the disturbed layer can be increased from the originally programmed voltage levels.

For the reasons stated above and for other reasons that will become apparent to those skilled in the art upon reading and understanding the present specification, there is a need in the art for reducing the effects of program disturb.

DETAILED DESCRIPTION

Figure 1:
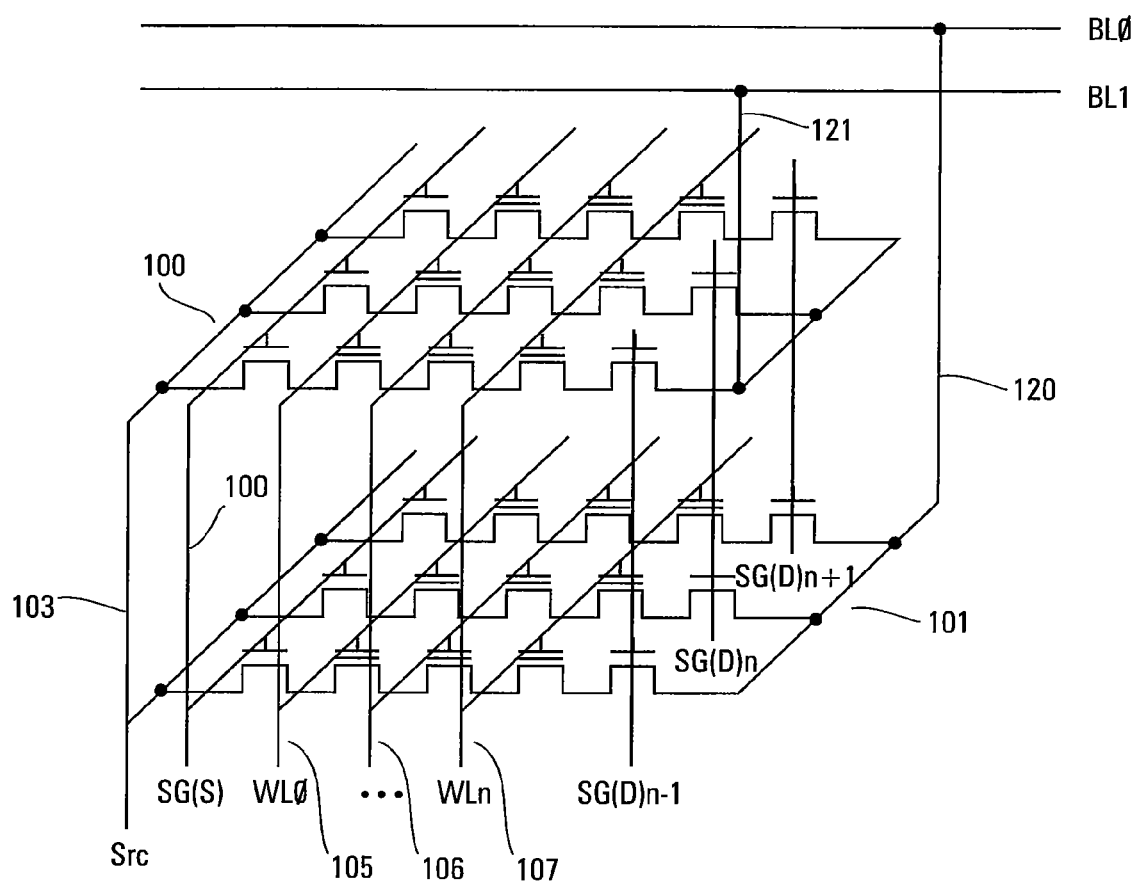
FIG. 1 shows a schematic diagram of a typical prior art two layer stacked NAND memory array.
Figure 2A:
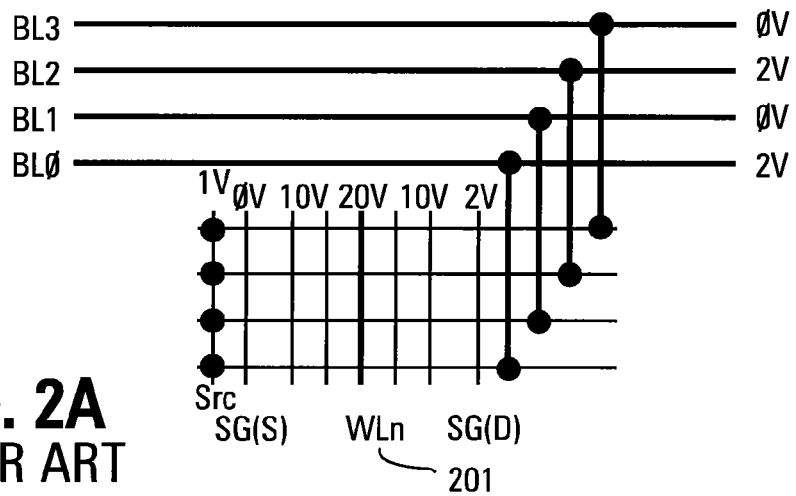
FIG. 2A shows a diagram of typical prior art biasing for a program operation in a four layer stacked NAND memory array.
Figure 2B:
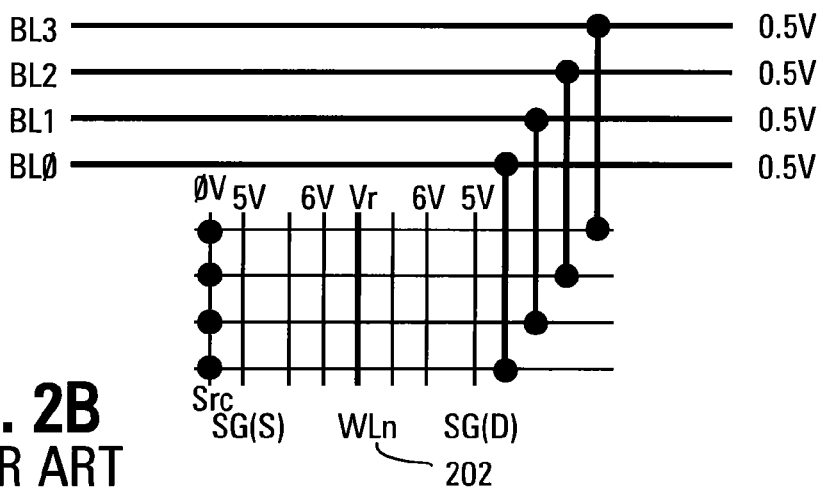
FIG. 2B shows a diagram of typical prior art biasing for a sense operation in a four layer stacked NAND memory array.
Figure 2C:
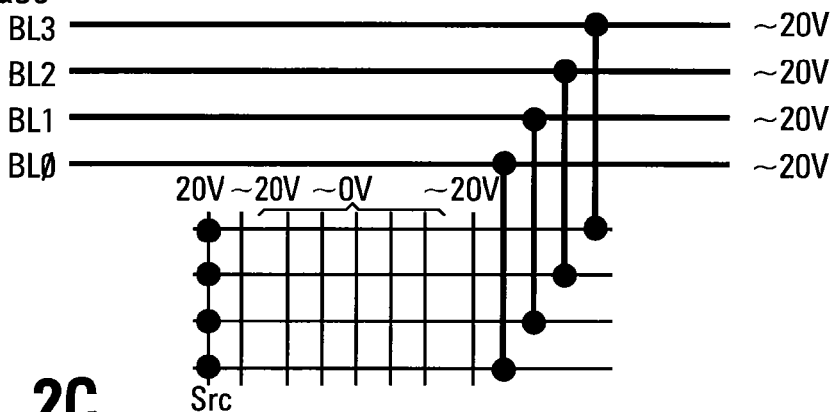
FIG. 2C shows a diagram of typical prior art biasing for an erase operation in a four layer stacked NAND memory array.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 3:
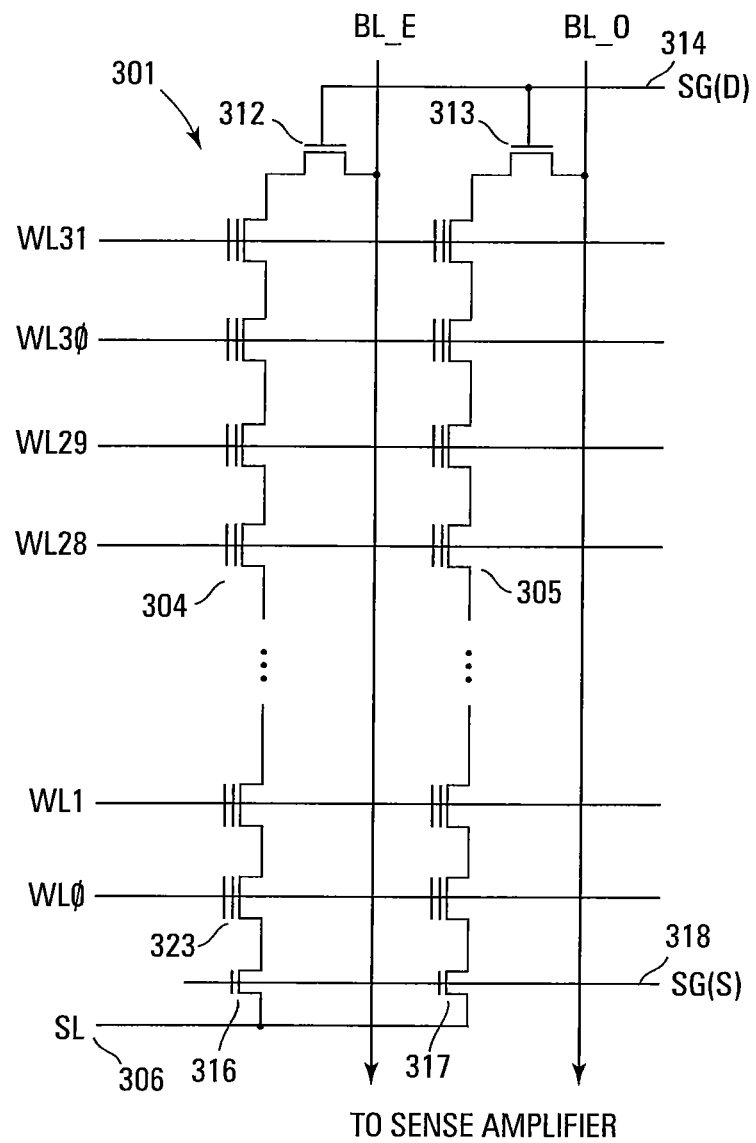
FIG. 3 shows a schematic diagram of one embodiment of a portion of a NAND architecture memory array.

FIG. 3 illustrates a schematic diagram of one embodiment of a portion of a single layer of a NAND architecture memory array 301 comprising series strings of non-volatile memory cells. As discussed subsequently, the stacked array architecture can include multiple layers of the embodiment of FIG. 3. The schematic diagram of FIG. 3 is for purposes of illustration only as the memory array architecture is not limited to the illustrated NAND architecture. Alternate embodiments can use NOR or other architectures as well.

The memory array 301 comprises an array of non-volatile memory cells (e.g., floating gate) arranged in columns such as series strings 304, 305. Each of the cells is coupled drain to source in each series string 304, 305. An access line (e.g. word line) WL0-WL31 that spans across multiple series strings 304, 305 is coupled to the control gates of each memory cell in a row in order to bias the control gates of the memory cells in the row. Data lines, such as even/odd bit lines BL_E, BL_O, are coupled to the series strings and eventually each bit line is coupled to a page buffer with sense circuitry that detects the state of each cell by sensing current or voltage on a selected bit line.

Each series string 304, 305 of memory cells is coupled to a source line 306 by a source select gate 316, 317 (e.g., transistor) and to an individual bit line BL_E, BL_O by a drain select gate 312, 313 (e.g., transistor). The source select gates 316, 317 are controlled by a source select gate control line SG(S) 318 coupled to their control gates. The drain select gates 312, 313 are controlled by a drain select gate control line SG(D) 314.

Each memory cell can be programmed as a single level cell (SLC) or a multiple level cell (MLC). Each cell's threshold voltage ($V_t$) is indicative of the data that is stored in the cell. For example, in an SLC, a $V_t$ of 2.5V might indicate a programmed cell while a $V_t$ of −0.5V might indicate an erased cell. An MLC uses multiple $V_t$ ranges that each indicates a different state. Multilevel cells can take advantage of the analog nature of a traditional flash cell by assigning a bit pattern to a specific $V_t$ range. This technology permits the storage of data values representing two or more bits per cell, depending on the quantity of $V_t$ ranges assigned to the cell.

A sense operation on a stacked memory array architecture senses multiple layers simultaneously. In order to reduce the errors experienced during a sense operation on memory cells that have experienced a program disturb condition, for example, a sense offset can be used on a per layer basis. For instance, the sense conditions for each layer are changed responsive (e.g., according) to the programming rate of that particular layer in relation to the other layers. The programming rate can, for example, be determined at manufacture or predetermined.

In one embodiment, changing the sense conditions on a per layer basis can include shifting the target $V_t$ range of slower programming layers to a lower $V_t$ range relative to a $V_t$ of a faster programming layer. This can be accomplished by sensing a higher sense current for the slower programming layers, precharging the bit lines of the slower programming layers to a higher pre-charge voltage, sensing the bit lines of slower programming layers with a higher bit line voltage than faster programming layers, and/or using a shorter bit line discharge time for the slower programming layers, relative to faster programming layers, during the sense operation. Alternate embodiments can use other ways to change the sense conditions on a per layer basis.

Figure 4:
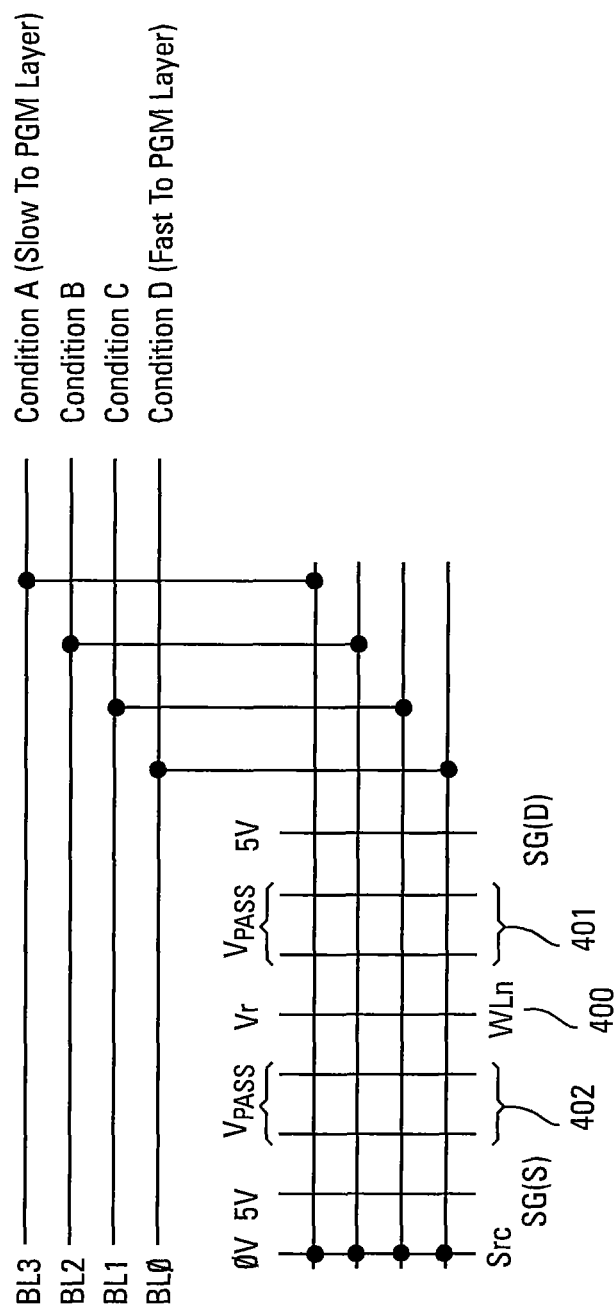
FIG. 4 shows a diagram of one embodiment of biasing for providing a sense offset by layer.

FIG. 4 illustrates one embodiment of biasing for providing a sense offset according to layer. The diagram of FIG. 4 shows four layers that are respectively selected by their respective bit line BL0-BL3. Physical connections are denoted by a dot on intersections of signal lines. For example, the source line SRC is connected to each of the four layers while each bit line BL0-BL3 is only connected to its respective layer.

The diagram of FIG. 4 further shows a select gate source SG(S), a select gate drain SG(D), the source line SRC, and five word lines 400-402 that include the word line WLn 400 selected for reading. Even though the illustrated embodiment is shown with only five word lines for purposes of clarity, alternate embodiments are not limited to any certain number of word lines.

The sense operation is also not limited to only those voltages shown in FIG. 4. The illustrated sense operation turns on the SG(S) and SG(D) lines with 5V and applies 0V to the source line. The selected word line WLn 400 is biased with a read voltage $V_r$ of approximately 0-5V and unselected word lines are biased at a pass voltage $V_{PASS}$ (e.g., approximately 6V or greater). In one embodiment, $V_r$ is a ramped voltage (e.g., 0-5V). In another embodiment, $V_r$ is a fixed voltage in that range.

The condition (e.g., condition A-D) applied to each bit line BL0-BL3 is responsive to (e.g., depends upon) the programming rate of that particular layer. In one example, BL3 is shown to be coupled to a slow programming layer as compared to the other layers while BL0 is shown to be coupled to a faster programming layer when compared to the other layers. Thus, condition A would include a sense offset as discussed previously.

Figure 5:
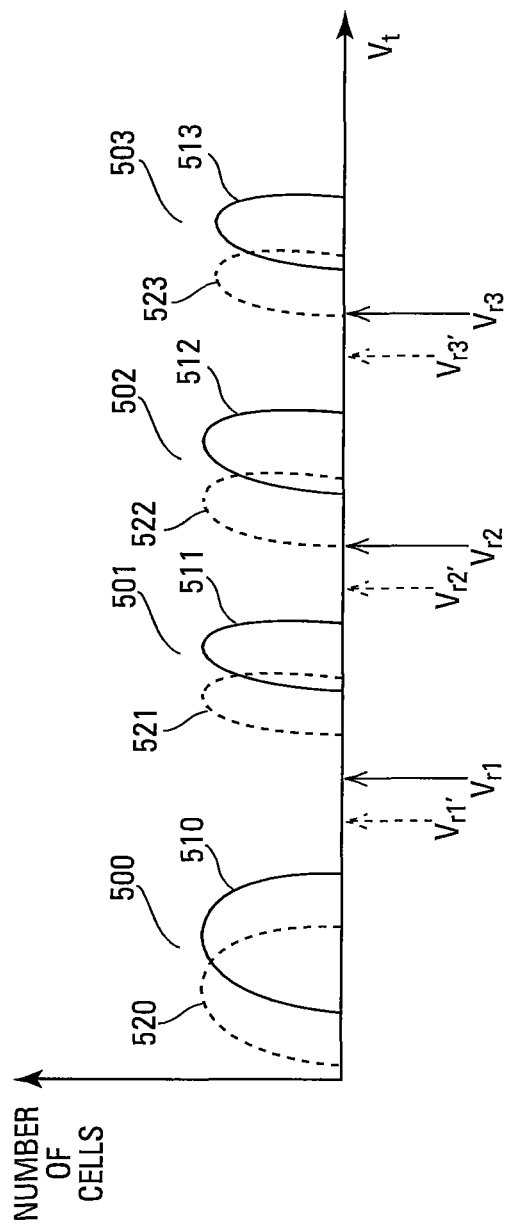
FIG. 5 shows a diagram of one embodiment of threshold voltage distributions for both slow and fast programming layers in accordance with the embodiment of FIG. 4.

FIG. 5 illustrates one embodiment of threshold voltage distributions 500-503 for both slow and fast programming layers of a stacked memory array architecture. One distribution 500 represents an erased state. The other distributions 501-503 represent programmed states. The different sense voltages $V_{r1}$-$V_{r3}$ for the various programmed states are also indicated.

The slower programming cells are located in the distributions 520-523 that have a lower $V_t$ than the distributions 510-513 of the faster programming cells. The slower programming cells would then apply the substantially lower threshold voltages $V_{r1}$-$V_{r3}$ to the common selected word line during a sense operation.

Figure 6:
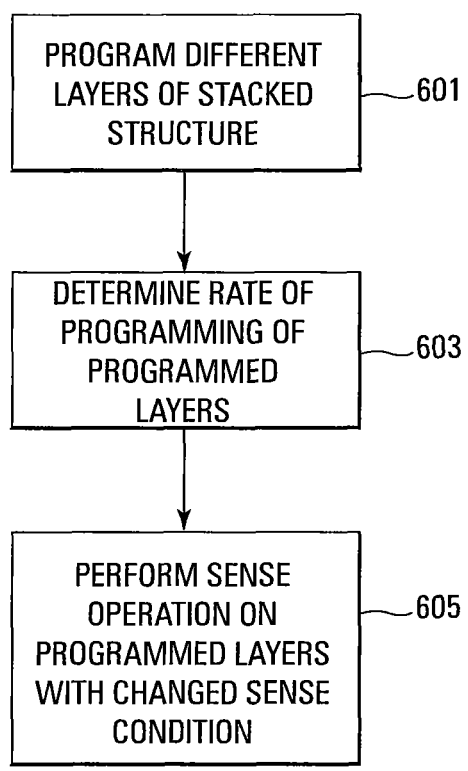
FIG. 6 shows a flowchart of one embodiment of a method for performing a sense operation on a memory array in accordance with the embodiment of FIG. 4.

FIG. 6 illustrates a flowchart of one embodiment of a method for performing a sense operation on a stacked memory array architecture. The memory cells of different layers of the stacked memory array architecture are programmed 601. This can be accomplished by applying a programming pulse (e.g., 15V) to the common word line of the different layers selected for programming. Applying the programming pulse to the common word line applies the programming pulse to all of the control gates of memory cells coupled that particular word line. A particular layer can be selected for programming by an enable voltage being applied to a bit line coupled to select the particular layer.

A programming rate is determined for each of the just programmed layers of the stacked memory array architecture 603. Determining the programming rate can be accomplished by sensing the just programmed memory cells to determine which have programmed faster than others. Determining the programming rate might also be accomplished by reading a known programming rate for particular layers that is stored in a register associated with that particular layer, or in the particular memory array layer itself, that indicates a programming rate for that particular layer.

Once a programming rate is determined for each programmed layer, a sense operation (e.g., program verify operation) can be performed on the layers that were just programmed using changed sense conditions 605 (e.g., shifting the $V_t$ distribution of the slower programming layer(s) to a lower voltage range) as explained previously. For example, these changed sense conditions can include a higher sense current, a higher pre-charge bit line voltage, a higher sense bit line voltage, or shorter bit line discharge time at sensing.

Figure 7:
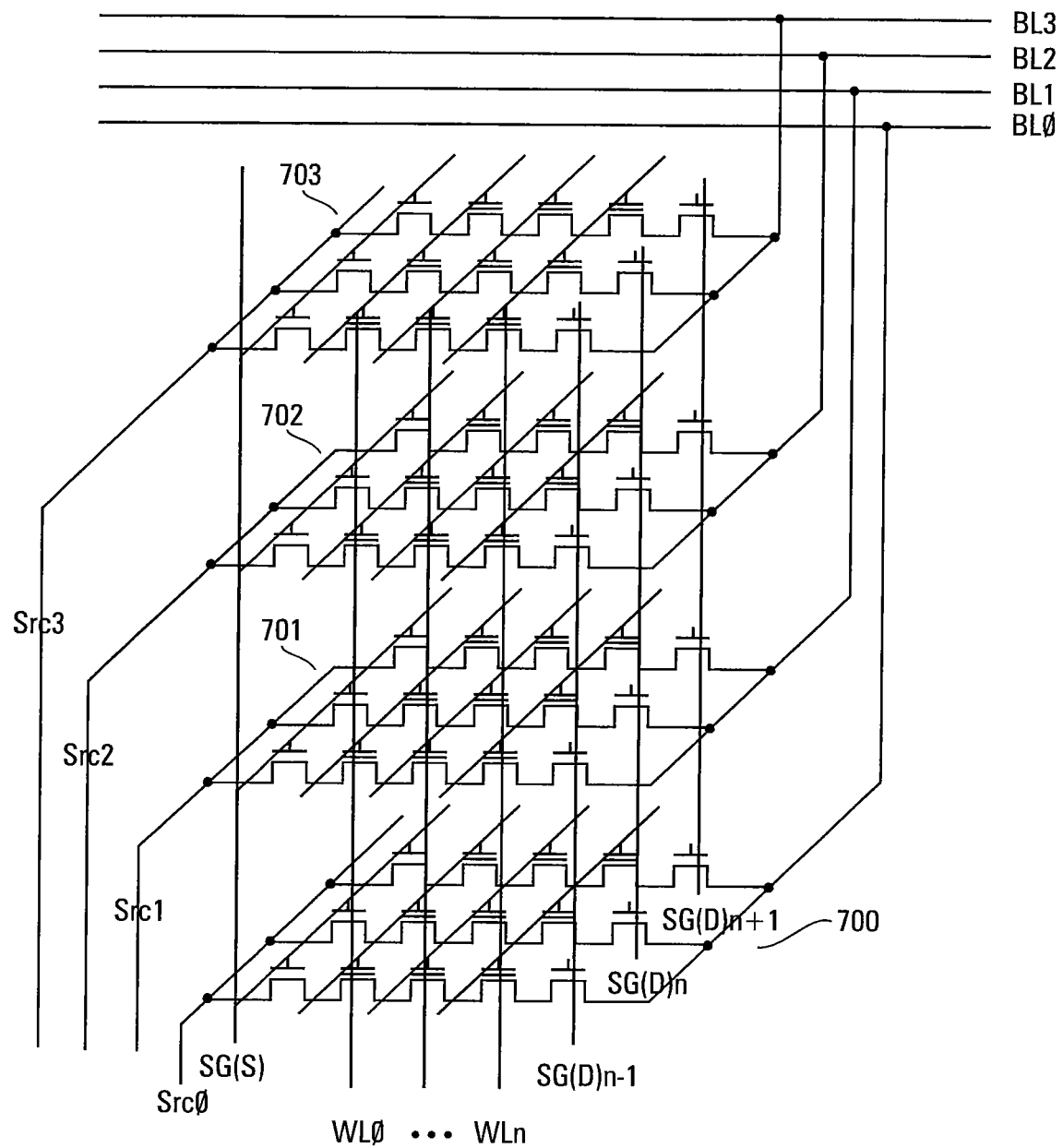
FIG. 7 shows a schematic diagram of an alternate embodiment of a stacked memory array device architecture.

FIG. 7 illustrates a schematic diagram of an alternate embodiment of a stacked memory array device architecture in accordance with a sense method. The illustrated embodiment shows a stacked memory array with four layers 700-703. The bottom, first layer 700 is coupled to bit line BL0, the second layer 701 is coupled to bit line BL1, the third layer 702 is coupled to bit line BL2, and the top, fourth layer 703 is coupled to bit line BL3. Each bit line is used to select the respective layer 700-703 for programming.

Unlike the embodiment of FIG. 4 that has a common source line between all layers, the embodiment of FIG. 7 has a different source line for each layer. Thus, FIG. 7 shows the first layer 700 coupled to source line SRC0. The second layer 701 is coupled to source line SRC1. The third layer 702 is coupled to source line SRC2. The fourth layer 703 is coupled to source line SRC3.

In this embodiment, a particular word line is common to all layers 700-703. In other words, a signal applied to word line WLn is applied to the control gates of all of the memory cells on all layers 700-703 that are coupled to the word line WLn. Similarly, the SG(S) lines are common to all of the layers 700-703.

The SG(D) lines are common to all of the layers 700-703 but only between a particular SG(D) transistor for each layer. For example, SG(D)n−1 is only coupled to all SG(D)n−1 transistors for all the layers 700-703. SG(D)n is only coupled to all SG(D)n transistors for all of the layers 700-703. SG(D)n+1 is only coupled to all SG(D)n+1 transistors for all of the layers 700-703.

Figure 8:
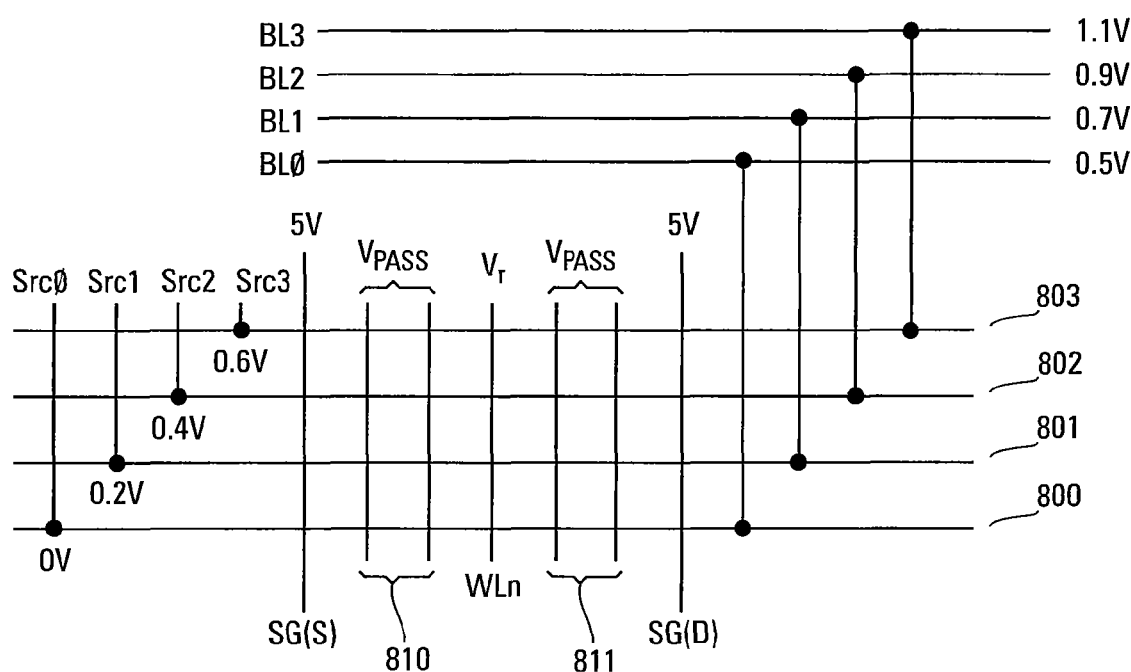
FIG. 8 shows a diagram of one embodiment for bit line and source line biasing in accordance with the embodiment of FIG. 7.

FIG. 8 illustrates one embodiment of sense operation biasing using the structure of FIG. 7. The voltages shown in FIG. 8 and described subsequently are for purposes of illustration only since other voltages can be used. For the purposes of this example, it is assumed that the top layer 803 is the slowest programming layer while the bottom layer 800 is the fastest programming layer. The middle two layers 802, 801 have progressively faster programming rates from top to bottom. It is also assumed that, during the sense operation, the selected word line WLn for all of the layers is biased at $V_r$ and the unselected word lines 810, 811 are biased at a pass voltage $V_{PASS}$ (e.g., 6V). The select gate lines SG(S) and SG(D) are biased at an enable voltage (e.g., 5.0V).

A voltage is applied to each individual source line SRC1-SRC3 depending on the programming rate of the selected layer 800-803. The slower programming layers having a higher source line voltage and the faster programming layers have a lower source line voltage. In the illustrated example, SRC0 is biased at 0V, SRC1 is biased at 0.2V, SRC2 is biased at 0.4V, and SRC3 is biased at 0.6V.

The difference between the source line voltage and the read voltage ($V_r$) applied to the selected word line WLn determines the actual voltage applied to the control gates of the memory cells of the selected layer. Since the selected word line WLn is common to all of the layers, this enables each individual layer to have a different voltage selectively applied to the control gates of the selected layer. This has the effect of shifting the $V_t$ sense voltage range to compensate for the programming disturb encountered by the sensed layer.

Thus, assuming a $V_r$ of 1.0V for the purposes of illustration, a word line voltage of Vr-SRC0 (e.g., 1V−0V=1V) is effectively applied to the selected control gates of the bottom, first layer 800. A word line voltage of Vr-SRC1 (e.g., 1V−0.2V=0.8V) is effectively applied to the selected control gates of the second layer 801. A word line voltage of Vr-SRC2 (e.g., 1V−0.4V=0.6V) is effectively applied to the selected control gates of the second layer 802. A word line voltage of $V_r$−SRC3 (e.g., 1V−0.6V=0.4V) is effectively applied to the selected control gates of the top, fourth layer 803.

The embodiment of FIG. 8 also shows that the bit line voltage can be different for each layer, depending on the programming rate of that particular layer. The bit line voltages are different in order to maintain the same voltage delta between the bit line and the source line for each layer. Thus, assuming the voltages of FIG. 8 are used, the bit line BL3 for the top, slowest layer 703 is biased at 1.1 V. The bit line BL2 for the next fastest layer 702 is biased at 0.9V. The bit line BL1 for the next fastest layer 701 is biased at 0.7V. The bit line BL0 for the fastest layer 700 is biased at 0.5V. These different bit line voltages maintain the same voltage delta (e.g., 0.5V) for each of the layers. In the illustrated embodiment, the slower the programming of the layer 700-703 to which the bit line is coupled, the higher the bit line voltage.

Figure 9:
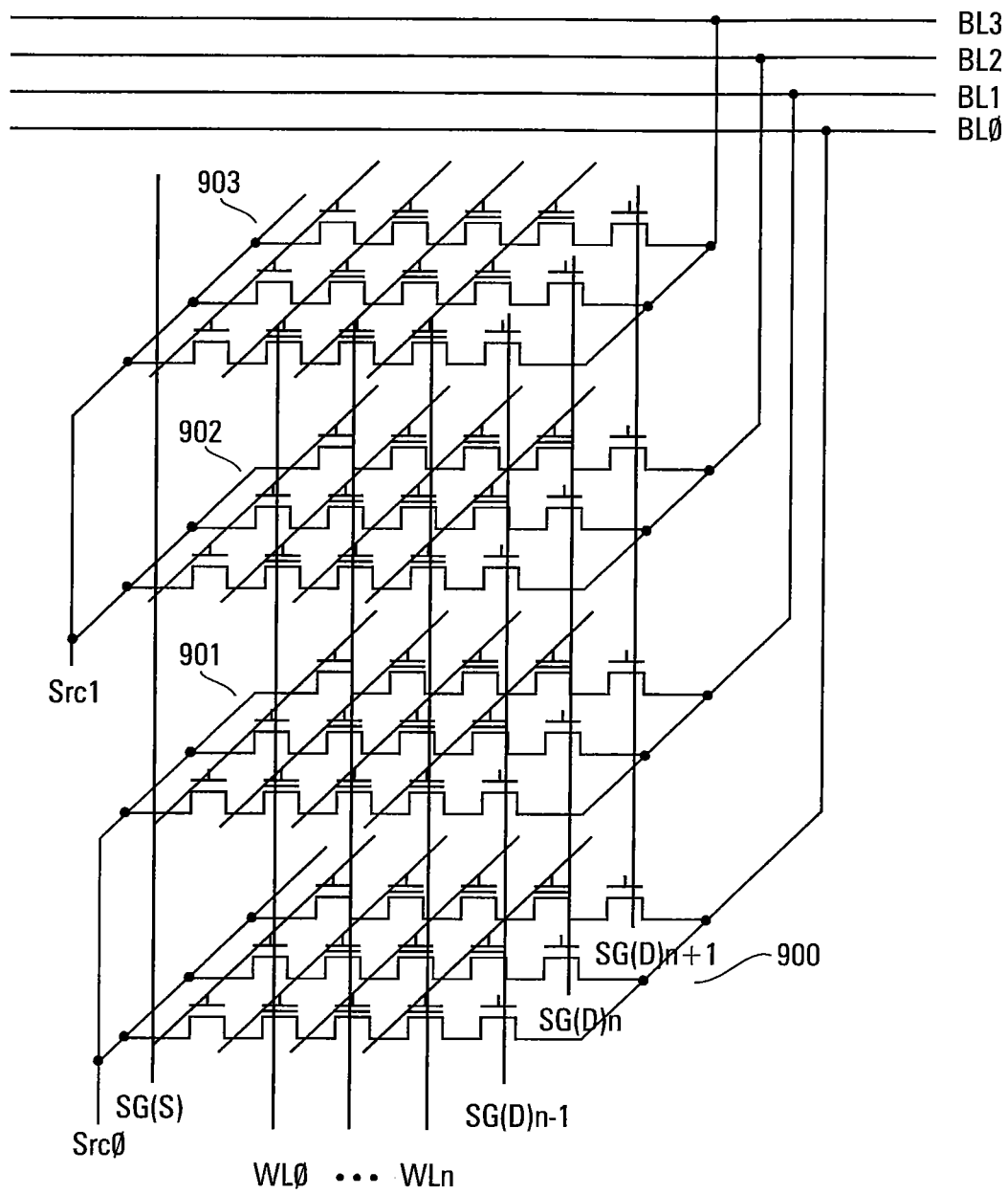
FIG. 9 shows a schematic diagram of another embodiment of a stacked memory array architecture.

FIG. 9 illustrates another alternate embodiment of a stacked memory array architecture. The illustrated embodiment shows a stack memory array with four layers 900-903. The bottom, first layer 900 is coupled to bit line BL0, the second layer 901 is coupled to bit line BL1, the third layer 902 is coupled to bit line BL2, and the top, fourth layer 903 is coupled to bit line BL3. Each bit line is used to select its respective layer 900-903 for programming.

The embodiment of FIG. 9 has a different source line for each group of X layers. In the embodiment of FIG. 9, the first layer 900 and the second layer 901 are coupled to one source line SRC0. The third layer 902 and the fourth layer 903 are coupled to another source line SRC1. While the embodiment of FIG. 9 shows each two layers coupled to a different source line, alternate embodiments can have X equal to some other number than two.

In yet another embodiment, each different source line might be coupled to different quantities of layers than other source lines. For example, three of the faster programming layers might be coupled to one source line while four of the slower programming layers might be coupled to a different source line.

In this embodiment, a particular word line is common to all layers 900-903. In other words, a signal applied to word line WLn is applied to the control gates of all of the memory cells on all layers 900-903 that are coupled to the word line WLn. Similarly, the SG(S) lines are common to all of the layers 900-903.

The SG(D) lines are common to all of the layers 900-903 but only between a particular SG(D) transistor for each layer. For example, SG(D)n−1 is only coupled to all SG(D)n−1 transistors for all the layers 900-903. SG(D)n is only coupled to all SG(D)n transistors for all of the layers 900-903. SG(D)n+1 is only coupled to all SG(D)n+1 transistors for all of the layers 900-903.

Figure 10:
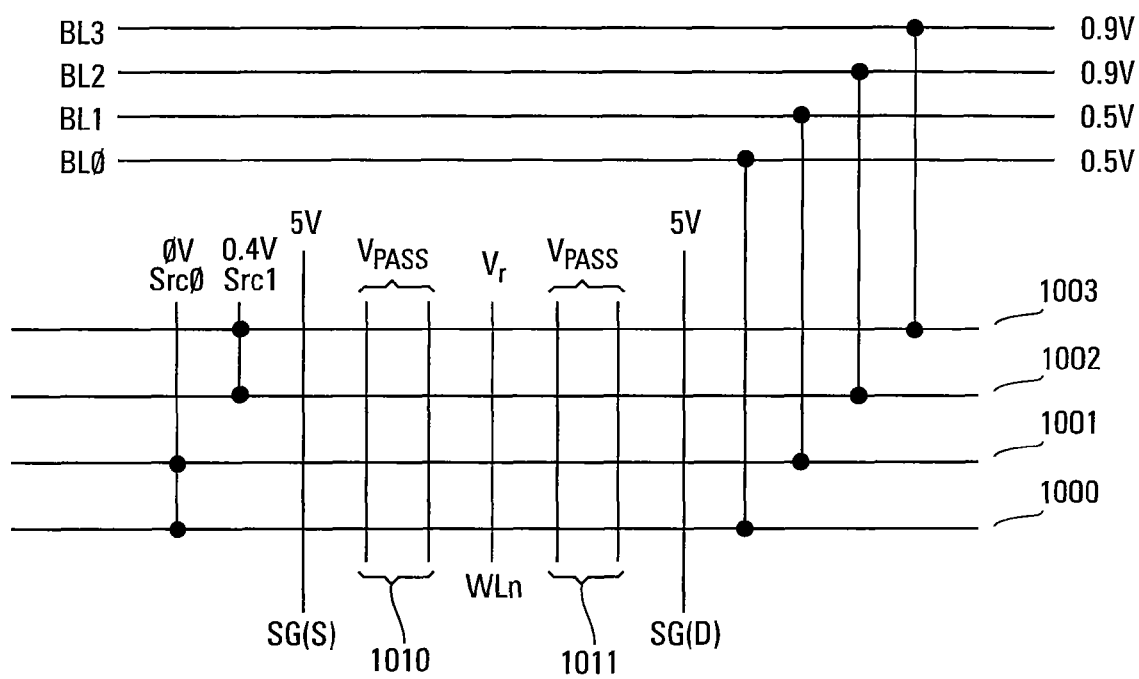
FIG. 10 shows a diagram of one embodiment of bit line and source line biasing in accordance with the embodiment of FIG. 9.

FIG. 10 illustrates one embodiment of sense operation biasing using the structure of FIG. 9. The voltages shown in FIG. 10 and described subsequently are for purposes of illustration only since other voltages can be used. For the purposes of this example, it is assumed that the top layer 1003 is the slowest programming layer while the bottom layer 1000 is the fastest programming layer. The middle two layers 1002, 1001 have progressively faster programming rates from top to bottom. It is also assumed that, during the sense operation, the selected word line WLn for all of the layers is biased at $V_t$ and the unselected word lines 1010, 1011 are biased at a pass voltage $V_{PASS}$ (e.g., 6V). The select gate lines SG(S) and SG(D) are biased at an enable voltage (e.g., 5.0V).

A source line voltage is applied to each source line SRC0, SRC1 depending on the programming rate of the layers to which the source lines are coupled. Since it is assumed in this example that the top-most layers 1002, 1003 are the slower programming layers, SRC1 is biased at a higher voltage than SCR0 that is coupled to the faster programming layers 1000, 1001. In the illustrated example, SRC0 is biased at 0V and SRC1 is biased at 0.4V.

The bit lines BL0-BL3 are organized in the same groups of X layers as the source lines and are biased to maintain the same voltage delta between the bit line and the source line for each group of X layers. In the illustrated example, bit lines BL2 and BL3 are biased at 0.9V while bit lines BL0 and BL1 are biased at 0.5V. This maintains a 0.5V voltage delta between the bit lines and the source lines for their respective group. In other words, the slower programming layers 1002, 1003 have the higher bit line voltages as compared to the faster programming layers 1000, 1001.

Figure 11:
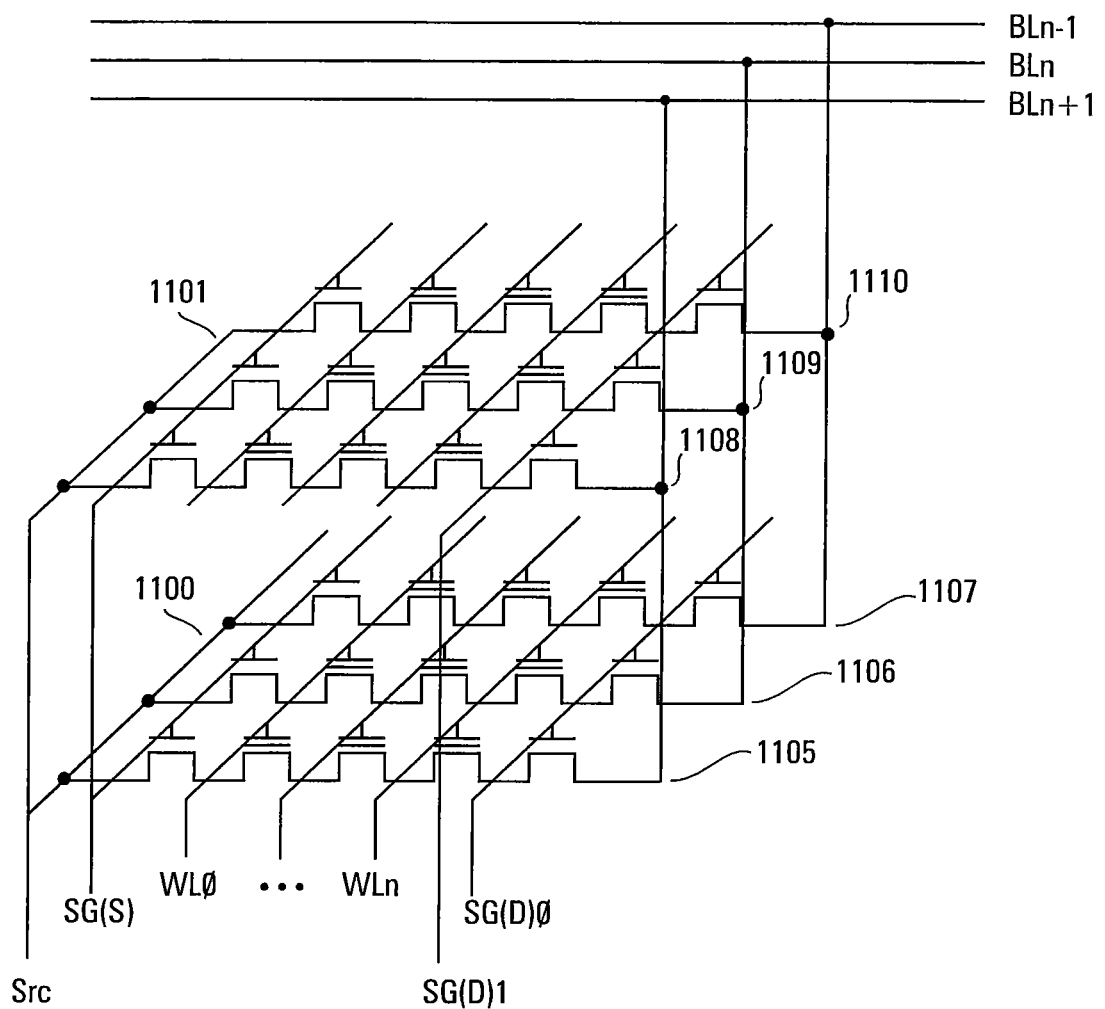
FIG. 11 shows a diagram of yet another embodiment of a stacked memory array architecture.

FIG. 11 illustrates yet another alternate embodiment of a stacked memory array architecture. This embodiment includes two layers 1100, 1101. Each series string 1105-1107, 1108-1110 in each layer 1100, 1101 is coupled to a common bit line BLn−1, BLn, BLn+1. For example, a first series string 1105 in the bottom layer 1100 shares the same bit line BLn+1 with the first series string 1108 in the top layer 1101. The second series string 1106 in the bottom layer 1100 shares the same bit line BLn with the second series string 1109 in the top layer 1101. The third series string 1107 in the bottom layer 1100 shares the same bit line BLn−1 with the third series string 1110 in the top layer 1101. This pattern repeats for any number of series strings in any number of layers.

The word lines WL0-WLn are common for each layer 1100, 1101. In other words, the control gates of a first row of memory cells in both the bottom layer 1100 and the top layer 1101 share the same word line WLn. The select gate source SG(S) line is also common between layers. The source line SRC is common to all layers. The select gate drain SG(D) line is only common between select gate drain transistors of each layer 1100, 1101. For example, the select gate drain transistors of the bottom layer 1100 share SG(D)0. The select gate drain transistors of the top layer 1101 share SG(D)1. In the embodiment of FIG. 11, the select gate drain lines SG(D)0-SG(D)1 are used to select and deselect each layer 1100, 1101.

Figure 12A:
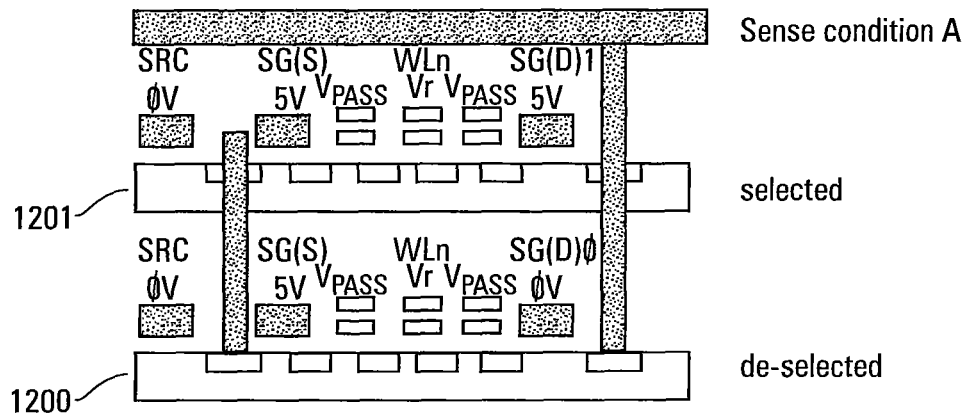
FIG. 12A shows a diagram illustrating word line biasing for slower programming layers in accordance with the embodiment of FIG. 11.
Figure 12B:
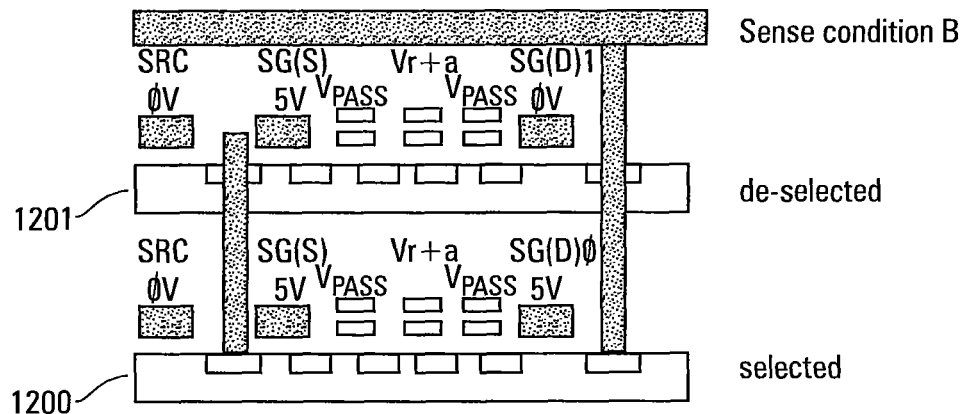
FIG. 12B shows a diagram illustrating word line biasing that includes an offset voltage for faster programming layers in accordance with the embodiment of FIG. 11.

FIGS. 12A and 12B illustrate diagrams of layer selection and word line offset by layer in accordance with the embodiment of FIG. 11. FIG. 12A illustrates word line biasing for slower programming layers. FIG. 12B illustrates word line biasing that includes an offset voltage for faster programming layers. The embodiments of FIGS. 12A and 12B assume that the top layer 1201 is the slower programming layer and the bottom layer 1200 is the faster programming layer. The word line biasing offset voltage changes the sense condition during a sense operation to shift the $V_t$ voltage range.

Referring to FIG. 12A, the top layer 1201 is selected by an enable voltage (e.g., 5V) on the SG(D)1 line. The bottom layer 1200 is deselected by a disable voltage (e.g., 0V) on the SG(D)0 line. The common source line is biased at a reference voltage (e.g., 0V) and the common select gate source SG(S) line is biased at an enable voltage (e.g., 5V).

Since the top layer 1201 is assumed to be the slower programming layer, the common selected word line WLn is biased at a sense voltage of V, without an offset voltage. This produces a sense Condition A on the bit line. Even though the same row of the lower layer(s) experience the same $V_t$ on their control gates, those layers are deselected by the disable voltage on the select gate drain lines.

Referring to FIG. 12B, the top layer 1201 is deselected by a disable voltage (e.g., 0V) on the SG(D)1 line. The bottom layer 1200 is selected by an enable voltage (e.g., 5V) on the SG(D)0 line. The common source line is biased at a reference voltage (e.g., 0V) and the common select gate source SG(S) line is biased at an enable voltage (e.g., 5V).

Since the bottom layer 1200 is assumed to be the faster programming layer, the common selected word line WLn is biased at a sense voltage of $V_t$+a where 'a' is the offset voltage that shifts the $V_t$ voltage range during the sense operation to take into account the memory cells with the increased threshold voltage. The offset voltage is added to the sense voltage when the faster programming layer is selected. This produces the changed Condition B on the bit line that can compensate for the program disturb condition.

Figure 13:
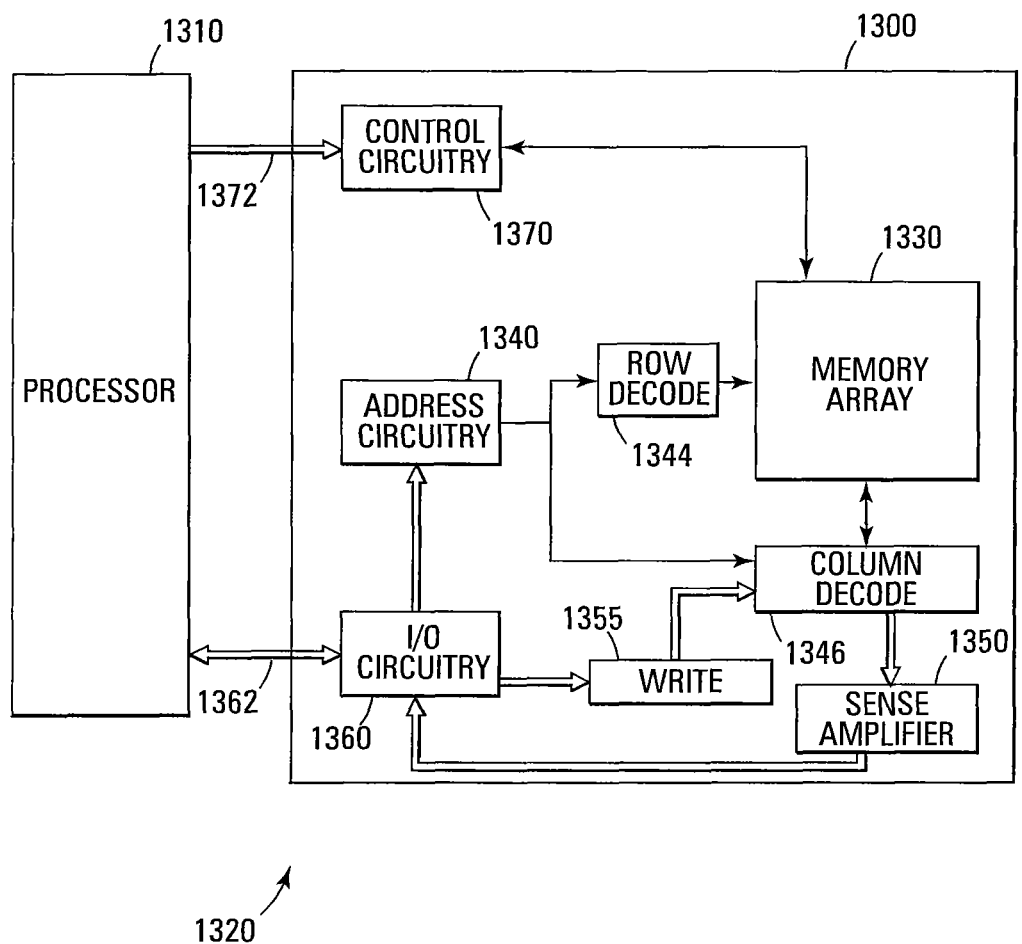
FIG. 13 shows a block diagram of one embodiment of a memory system that can incorporate a stacked memory array architecture using the described methods for sense operations.

FIG. 13 illustrates a functional block diagram of a memory device 1300 that can comprise a stacked memory array architecture. The memory device 1300 is coupled to an external processor 1310. The processor 1310 may be a microprocessor or some other type of controller. The memory device 1300 and the processor 1310 form part of a memory system 1320.

The memory device 1300 includes an array 1330 of memory cells (e.g., non-volatile memory cells). The memory array 1330 is arranged in banks of word line rows and bit line columns. In one embodiment, the columns of the memory array 1330 comprise series strings of memory cells.

Address buffer circuitry 1340 is provided to latch address signals provided through I/O circuitry 1360. Address signals are received and decoded by a row decoder 1344 and a column decoder 1346 to access the memory array 1330.

The memory device 1300 reads data in the memory array 1330 by sensing voltage or current changes in the memory array columns using sense amplifier circuitry 1350. The page buffers 1350, in one embodiment, are coupled to read and latch a row of data from the memory array 1330. The page buffers 1350, as previously described, include the sense circuitry as well as other circuits for performing a program verify operation. Data are input and output through the I/O circuitry 1360 for bidirectional data communication as well as the address communication over a plurality of data connections 1362 with the controller 1310. Write circuitry 1355 is provided to write data to the memory array.

Memory control circuitry 1370 decodes signals provided on control connections 1372 from the processor 1310. These signals are used to control the operations on the memory array 1330, including data read, data write (program), and erase operations. The memory control circuitry 1370 may be a state machine, a sequencer, or some other type of controller to generate the memory control signals. In one embodiment, the memory control circuitry 1370 is configured to control execution of the program verify embodiments of the present disclosure.

The memory device illustrated in FIG. 13 has been simplified to facilitate a basic understanding of the features of the memory. A more detailed understanding of internal circuitry and functions of flash memories are known to those skilled in the art.

CONCLUSION

In summary, one or more embodiments of a sense operation can reduce the errors resulting from sensing memory cells that have experienced a program disturb condition. This can be accomplished by changing sense conditions in response to a programming rate of a memory cell layer.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A memory device comprising:
a plurality of layers of memory cell arrays, each layer of the plurality of layers comprising:
a plurality of strings of memory cells;
wherein each layer of the plurality of layers is coupled to a single source line and a single data line; and
wherein the memory device is configured to bias each single source line with a respective source line voltage responsive to a programming rate for that respective layer.

2. The memory device of claim 1 and further including an access line coupled to a particular row of memory cells wherein the access line is common to the particular row of each of the plurality of layers.

3. The memory device of claim 1 wherein the memory device is configured to select a particular layer of the plurality of layers responsive to biasing the single data line coupled to the particular layer.

4. The memory device of claim 1 and further including a select gate source line that is common to all of the layers of the plurality of layers.

5. The memory device of claim 1 and further including a select gate drain line that is common to a particular one of a plurality of select gate drain transistors for each of the plurality of layers of memory cell arrays.

6. A memory device comprising:
a plurality of layers of memory cell arrays, each layer of the plurality of layers comprising:
a plurality of strings of memory cells;
wherein each layer of the plurality of layers is coupled to a single source line and a single data line; and
wherein the memory device is configured to shift a target threshold voltage range of a layer responsive to a programming rate for that layer.

7. The memory device of claim 1, wherein the memory device is coupled to a controller.

8. A memory device comprising:
a plurality of layers of memory cell arrays, each layer of the plurality of layers comprising:
a plurality of strings of memory cells;
a single data line coupled to each layer of the plurality of layers;
wherein the plurality of layers are arranged in a plurality of groups of the layers, where each group of the layers is coupled to a single source line; and
wherein each group of the layers comprises at least two of the layers of the plurality of layers;
wherein the memory device is configured to bias each single source line with a source line voltage that is responsive to a programming rate for its respective group of the layers.

9. A memory device comprising:
a plurality of layers of memory cell arrays, each layer comprising:
a plurality of strings of memory cells;
a different source line coupled to a different group of layers of the plurality of layers, wherein each group of layers comprises at least one of the layers; and
a plurality of data lines, a respective data line coupled to each layer of the plurality of layers wherein the memory device is configured to select a respective layer responsive to biasing of a respective one of the data lines and further wherein the data lines are grouped according to the plurality of layers coupled to a particular source line and the data lines within a particular group at substantially the same voltage;
wherein the memory device is configured to bias data lines coupled to a particular group of layers having a relatively slower programming rate at a higher voltage than data lines coupled to a group of layers having a relatively faster programming rate.

10. A memory device comprising:
a plurality of layers of memory cell arrays, each layer comprising:
a plurality of strings of memory cells;
a different source line coupled to each layer of the plurality of layers; and
a different data line coupled to each layer of the plurality of layers so that the plurality of strings in each layer is between the data line and the source line coupled to that layer;
wherein the memory device is configured to bias each different source line with a respective source line voltage responsive to a programming rate for that respective layer.

11. A memory device comprising:
a plurality of layers of memory cell arrays, each layer comprising:
a plurality of strings of memory cells;
a different source line coupled to each layer of the plurality of layers; and
a different data line coupled to each layer of the plurality of layers so that the plurality of strings in each layer is between the data line and the source line coupled to that layer;
wherein the memory device is configured to bias each different source line with a respective source line voltage and each different data line with a respective data line voltage so that a difference between the respective source line voltage and the respective data line voltage is the same for each layer.

12. The memory device of claim 9 wherein respective groups of the layers of the plurality of groups of the layers have different numbers of the layers.

* * * * *